US012733295B2

(12) United States Patent
Yamada et al.

(10) Patent No.: US 12,733,295 B2
(45) Date of Patent: Sep. 8, 2026

(54) MANUFACTURING METHOD OF DISPLAY DEVICE USING DEFORMABLE SPACERS

(71) Applicant: Japan Display Inc., Tokyo (JP)

(72) Inventors: Kazuyuki Yamada, Tokyo (JP); Keisuke Asada, Tokyo (JP); Kenichi Takemasa, Tokyo (JP); Daiki Isono, Tokyo (JP)

(73) Assignee: Japan Display Inc., Tokyo (JP)

( * ) Notice: Subject to any disclaimer, the term of this patent is extended or adjusted under 35 U.S.C. 154(b) by 348 days.

(21) Appl. No.: 18/356,321

(22) Filed: Jul. 21, 2023

(65) Prior Publication Data

US 2024/0047605 A1 Feb. 8, 2024

(30) Foreign Application Priority Data

Aug. 5, 2022 (JP) ................................ 2022-125342

(51) Int. Cl.
*H10H 20/01* (2025.01)
*H10W 90/00* (2026.01)
*H10W 72/20* (2026.01)

(52) U.S. Cl.
CPC .......... *H10H 20/018* (2025.01); *H10W 90/00* (2026.01); *H10W 72/242* (2026.01); *H10W 72/252* (2026.01); *H10W 90/722* (2026.01)

(58) Field of Classification Search
CPC ........... G02F 1/1339; G09G 2300/0443–0447; G09G 2300/0456; H05B 33/24; H01L 25/167; G06F 1/18–189
See application file for complete search history.

(56) References Cited

U.S. PATENT DOCUMENTS

| | | | | |
|---|---|---|---|---|
| 11,658,262 | B1 * | 5/2023 | Cheng | H10H 20/018 438/22 |
| 2010/0271293 | A1 * | 10/2010 | Sonoyama | H10K 59/80 445/24 |
| 2017/0358604 | A1 * | 12/2017 | Lee | H10D 86/451 |
| 2020/0402867 | A1 | 12/2020 | Yanagawa et al. | |
| 2021/0110748 | A1 | 4/2021 | Kim et al. | |
| 2022/0109081 | A1 | 4/2022 | Keisuke | |
| 2022/0310877 | A1 * | 9/2022 | Chen | H10H 20/832 |
| 2023/0071280 | A1 * | 3/2023 | Ito | G02B 6/0068 |
| 2024/0421264 | A1 * | 12/2024 | Lee | H10D 86/441 |

FOREIGN PATENT DOCUMENTS

| | | | |
|---|---|---|---|
| JP | 2003149649 | A | 5/2003 |
| JP | 2021-163945 | A | 10/2021 |
| WO | 2021/010079 | A1 | 1/2021 |

OTHER PUBLICATIONS

Japanese Office Action dated May 19, 2026 for the corresponding Japanese Patent Application No. 2022-125342, with English machine translation.

* cited by examiner

*Primary Examiner* — Ismail A Muse
(74) *Attorney, Agent, or Firm* — Michael Best & Friedrich LLP

(57) ABSTRACT

Disclosed is a manufacturing method of a display device including: transferring at least one inorganic light-emitting diode formed over a base substrate onto a first carrier substrate; arranging a plurality of spacers configured to be elastically deformed over a substrate over which a pixel including a plurality of sub-pixels is arranged; and transforming the at least one inorganic light-emitting diode over the first carrier substrate onto the substrate. The manufacturing method may further include removing the plurality of spacers.

18 Claims, 18 Drawing Sheets

MANUFACTURING METHOD OF DISPLAY DEVICE USING DEFORMABLE SPACERS

CROSS REFERENCE TO RELATED APPLICATIONS

This application claims the benefit of priority from the prior Japanese Patent Application No. 2022-125342, filed on Aug. 5, 2022, the entire contents of which are incorporated herein by reference.

FIELD

An embodiment of the present invention relates to a display device and its manufacturing method. For example, an embodiment of the present invention relates to a display device using an inorganic light-emitting diode as a light-emitting element and a manufacturing method thereof.

BACKGROUND

In recent years, display devices with inorganic light-emitting diodes (LEDs) provided in pixels arranged in a matrix form have been developed. LEDs exhibit high reliability and are capable of emitting light with high luminance and high efficiency compared with organic light-emitting diodes (organic electroluminescence elements) because LEDs utilize inorganic compounds including Groups 12, 13 and 15 elements such as indium, arsenic, zinc, and selenium. For these reasons, display devices with LEDs (LED displays) are expected to be highly reliable displays capable of providing high-contrast images with high brightness (see Japanese Patent Application Publications No. 2021-163945 and 2021-5632).

SUMMARY

An embodiment of the present invention is a manufacturing method of a display device. The manufacturing method includes: transferring at least one inorganic light-emitting diode formed over a base substrate onto a first carrier substrate; arranging a plurality of spacers configured to be elastically deformed over a substrate over which a pixel including a plurality of sub-pixels is arranged; and transforming the at least one inorganic light-emitting diode over the first carrier substrate onto the substrate.

An embodiment of the present invention is a manufacturing method of a display device. The manufacturing method includes: transferring at least one inorganic light-emitting diode formed over a base substrate onto a first carrier substrate; transferring the at least one inorganic light-emitting diode over the first carrier substrate onto a second carrier substrate; arranging a plurality of spacers configured to be elastically deformed onto a substrate over which a pixel including a plurality of sub-pixels is arranged, and transferring the at least one inorganic light-emitting diode over the second carrier substrate onto the substrate.

An embodiment of the present invention is a display device. The display device includes: a substrate over which a pixel including a plurality of sub-pixels is arranged; and a plurality of spacers arranged over the substrate and configured to be elastically deformed. Each of the plurality of sub-pixels has a pixel electrode, a protective insulating film covering an edge portion of the pixel electrode, and an inorganic light-emitting diode located over and electrically connected to the pixel electrode.

An embodiment of the present invention is a display device. The display device includes a substrate over which a pixel including a plurality of sub-pixels is arranged. Each of the plurality of sub-pixels has a pixel electrode, a protective insulating film covering an edge portion of the pixel electrode, and an inorganic light-emitting diode located over and electrically connected to the pixel electrode. The protective insulating film has a depressed portion at a top surface thereof.

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings and has the same function, and a detailed explanation may be omitted as appropriate. When a plurality of structures the same or similar to each other is denoted, this reference number is used, while a hyphen and a natural number are added when these structures are individually represented. Moreover, when a portion of a structure is shown, a lower-case alphabetical letter may be added after the reference number.

In this specification and in the claims, in describing the manner in which other structures are placed on top of one structure, the term "on top of" simply shall, unless otherwise specified, include both the placement of another structure directly above a structure, so as to be in contact with it, and the placement of another structure above a structure, through yet another structure. The term "above" shall include both cases.

In this specification and the claims, the expression "one structure is exposed from another structure" means a situation in which a part of one structure is not covered by another structure, including a situation in which the part not covered by the other structure is further covered by another structure. The expression also includes a situation in which one structure is not in contact with another structure.

Hereinafter, a display device and its manufacturing method according to an embodiment of the present invention are explained. The display device is a LED display and is equipped with a plurality of LEDs in each pixel as explained below.

1. OVERALL STRUCTURE OF DISPLAY DEVICE

Figure 1:
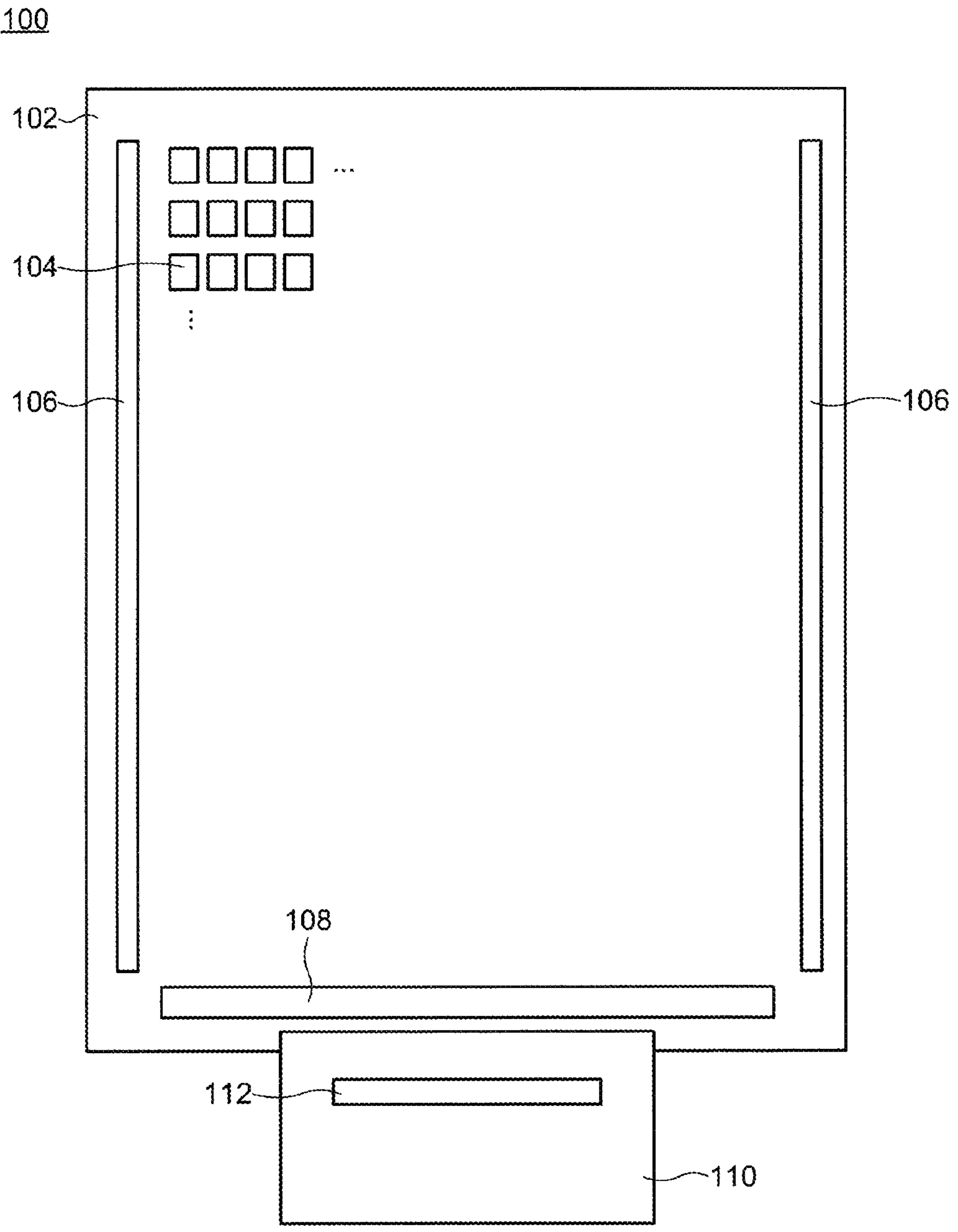
FIG. 1 is a schematic top view of a display device according to an embodiment of the present invention.

FIG. 1 shows a schematic top view of the display device 100. The display device 100 has a substrate 102 over which a variety of patterned thin films of insulators, conductors, and semiconductors is stacked, thereby forming a plurality of pixels 104, driver circuits (scanning line driver circuits 106, signal line driver circuit 108), and a variety of wirings (not illustrated) electrically connecting these components, and the like. The plurality of pixels 104 is arranged in a matrix form. A single region surrounding all of the pixels 104 is a display region, and the region outside the display region is called a peripheral region or a frame region. The plurality of wirings extends from the driver circuits to a side of the substrate 102 and is exposed at an edge portion of the substrate 102 to form a plurality of terminals (not illustrated). The plurality of terminals is electrically connected to a connector 110 such as a flexible circuit (FPC) board, by which a power source and various signals are supplied from an external circuit which is not illustrated to the driver circuits through the connector 110. Note that a driver IC 112 having an integrated circuit formed over a semiconductor substrate may be mounted on the substrate 102 or the connector 110 instead of or together with the signal line driver circuit 108.

The plurality of pixels 104 is each connected to the scanning line driver circuits 106 and the signal line driver circuit 108. The scanning line driver circuits 106 and the signal line driver circuit 108 generate signals for displaying images (video signals, gate signals, initialization signals, etc.) on the basis of the signals supplied from the external circuit and supply these signals to the plurality of pixels 104 along with the power source, by which the plurality of pixels 104 is controlled to allow images to be displayed on the display region.

2. STRUCTURE OF PIXEL

Figure 2A:
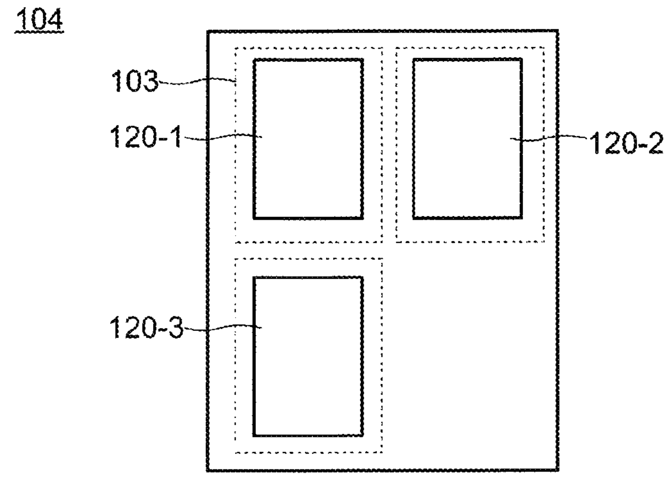
FIG. 2A is a schematic top view of a pixel of a display device according to an embodiment of the present invention.

A schematic top view of one pixel 104 is shown in FIG. 2A. As shown in FIG. 2A, each pixel 104 has a plurality of sub-pixels 103. Typically, each pixel 104 is composed of three sub-pixels 103 respectively providing the three primary colors, red, green, and blue. An LED 120 is arranged in each sub-pixel 103. For example, red-, green-, and blue-emissive LEDs 120-1, 120-2, and 120-3 may be respectively arranged in three sub-pixels 103. In this specification, the sub-pixel 103 includes one LED 120 and serves as the smallest unit providing color information. The pixel 104 is a rectangular region which includes all sub-pixels 103 providing different emission colors and surrounds the fewest sub-pixels 103.

Figure 2B:
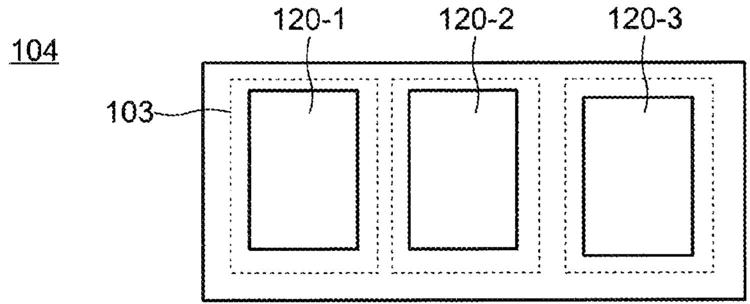
FIG. 2B is a schematic top view of a pixel of a display device according to an embodiment of the present invention.
Figure 2C:
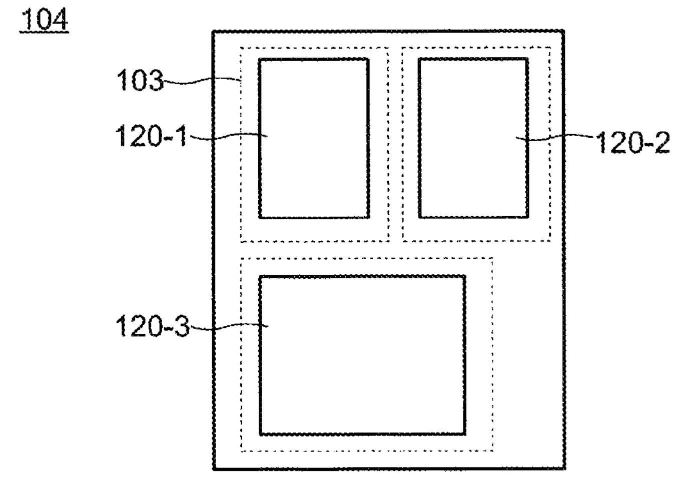
FIG. 2C is a schematic top view of a pixel of a display device according to an embodiment of the present invention.

The arrangement of the sub-pixels 103 in each pixel 104 is arbitrarily determined, and a plurality of LEDs 120 may be arranged in one row and one LED 120 may be arranged in another row as shown in FIG. 2A and FIG. 2C, for example. Alternatively, all of the LEDs 120 may be arranged in one row (FIG. 2B). The size (area) and height of the plurality of LEDs 120 disposed in each pixel 104 may also be arbitrarily set. That is, in each pixel 104, all of the LEDs 120 may have the same size and height, or at least one LED 120 may differ in size or height from at least another LED. The area of LED 120 may be selected from a range equal to or larger than $1.0\times10^2$ $\mu m^2$ and equal to or smaller than $1.0\times10^4$ $\mu m^2$, equal to or larger than $2.0\times10^2$ $\mu m^2$ and equal to or smaller than $5.0\times10^3$ $\mu m^2$, or equal to or larger than $1.0\times10^3$ $\mu m^2$ and equal to or smaller than $2.5\times10^3$ $\mu m^2$, for example. As an example, so-called micro LEDs with a size of approximately 15 μm×30 μm may be used.

In each sub-pixel 103, a pixel circuit operated by the signals supplied from the driver circuits is provided to control the LED 120. The configuration of the pixel circuit may be arbitrarily determined, and the pixel circuit is formed by combining one or more transistors, one or more capacitor elements, and the like as appropriate.

Figure 3A:
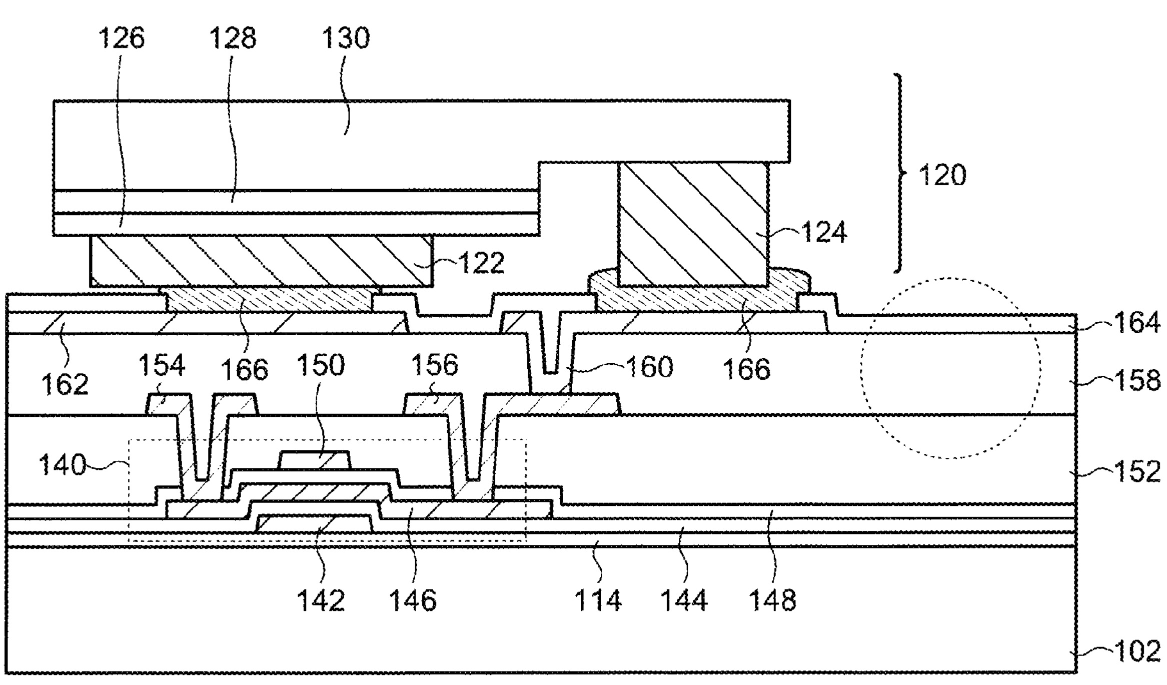
FIG. 3A is a schematic cross-sectional view of a sub-pixel of a display device according to an embodiment of the present invention.

An example of the sub-pixel 103 is demonstrated in the schematic cross-sectional view of FIG. 3A. Although only one transistor 140 is shown in FIG. 3A, each pixel circuit may include a plurality of transistors and may further include one or more capacitance elements as described above. The pixel circuit including the transistor 140 is provided over the substrate 102 directly or through an undercoat 114 which is an optional component. The transistor 140 shown in FIG. 3A is composed of a first gate electrode 142, a first gate insulating film 144 over the first gate electrode 142, a semiconductor film 146 over the first gate insulating film 144, a second gate insulating film 148 over the semiconductor film 146, a second gate electrode 150 over the second gate insulating film 148, an interlayer film 152 covering the second gate electrode 150 and the second gate insulating film 148, a first terminal 154 and a second terminal 156 electrically connected to the semiconductor film 146 through openings formed in the second gate insulating film 148 and the interlayer film 152, and the like. Although the transistor 140 has two gate electrodes sandwiching the semiconductor film 146, the configuration of the transistor 140 may be arbitrarily determined, and the transistor 140 may be a bottom-gate type or top-gate type transistor, for example.

The sub-pixel 103 may further include a planarization film 158 over the first terminal 154 and the second terminal 156, a pixel electrode 160 electrically connected to the second terminal 156 through an opening formed in the planarization film 158, a common electrode 162 disposed over the planarization film 158 and supplied with a constant potential, and a protective insulating film 164 covering edge portions of the pixel electrode 160 and the common electrode 162.

These components may be formed by applying known materials and deposition methods as appropriate. For example, a glass substrate, a quartz substrate, a substrate containing a metal such as stainless steel and aluminum, a substrate containing a polymeric material such as a polyimide, a polycarbonate, and a polyester, and the like may be used as the substrate 102. The substrate 102 may have flexibility. The undercoat 114, the first gate insulating film 144, the second gate insulating film 148, the interlayer film 152, and the protective insulating film 164 may each be composed of one or more layers containing a silicon-containing inorganic compound such as silicon oxide and silicon nitride using a chemical vapor deposition (CVD) method or a sputtering method. Alternatively, these films may be formed with one or more layers containing an inorganic compound such as aluminum oxide and aluminum nitride. The first gate electrode 142, the second gate electrode 150, the first terminal 154, the second terminal 156, the pixel electrode 160, and the common electrode 162 may be composed of a metal such as tantalum, molybdenum, tungsten, chromium, hafnium, titanium, aluminum, and copper using a CVD method or a sputtering method. The planarization film 158 may be formed using a polymeric material such as a polyimide, a polyamide, a polysiloxane, and an acrylic resin, for example. The interlayer film 152 may also be formed using a polymeric material. The semiconductor film 146 is also formed by applying a CVD method or a sputtering method. The semiconductor film 146 is configured to include silicon or an oxide semiconductor such as zinc oxide, indium-gallium oxide, and indium-gallium-oxide. The structure including the substrate 102 to the protective insulating film 164 is also referred to as an array substrate, a backplane substrate (shown as BP in the drawings), and the like. In the following description, the configuration including the substrate 102 to the protective insulating film 164 is referred to as a backplane substrate.

The LED 120 is provided over the backplane substrate. The LED 120 may include a stack including, for example, a p-type cladding layer 126, an active layer (emission layer) 128, and an n-type cladding layer 130, where an anode 122 and a cathode 124 are electrically connected to the p-type cladding layer 126 and the n-type cladding layer 130, respectively. Bumps 166 are formed over the common electrode 162 and the pixel electrode 160 as conductive adhesives, and the anode 122 and the cathode 124 of the LED 120 are electrically connected to the common electrode 162 and the pixel electrode 160, respectively, via the bumps 166. The bump 166 is an alloy containing a metal such as silver and tin, for example. Although not illustrated, the LED 120 may be provided with a buffer layer over the n-type cladding layer 130 (opposite surface with respect to the p-type cladding layer 126).

The p-type cladding layer 126, the active layer 128, and the n-type cladding layer 130 are each composed of one or more functional layers containing an inorganic semiconductor. The inorganic semiconductor includes, for example, a compound containing a Group 13 element and a Group 15 element. More specifically, a compound semiconductor containing aluminum, gallium, and/or indium as well as nitrogen, phosphorus, and/or arsenic is represented. Typically, a gallium-based material is represented. For example, gallium nitride-based materials such as gallium nitride (GaN), aluminum gallium nitride (AlGaN), and indium gallium nitride (InGaN) and gallium phosphide-based materials such as gallium phosphide (GaP) and aluminum indium gallium phosphorus (AlGaInP) are exemplified. A dopant may be included in each functional layer. As a dopant, the elements such as silicon, germanium, magnesium, zinc, cadmium, and beryllium are represented. The addition of these elements enables valence electron control of each functional layer, which not only enables maintenance of an intrinsic (i-type) property but also controls the band gap and imparts p-type or n-type conductivity. The active layer 128 may have a single layer structure or may have a quantum well structure. A quantum well structure is a structure in which a plurality of this films with different band gaps and thicknesses of 1 to 5 nm is alternately stacked, and an alternately stacked body of InGaN and GaN, an alternately stacked body of GaInAsP and InP, an alternately stacked body of AlInAs and InGaAs, and the like are exemplified.

Figure 3B:
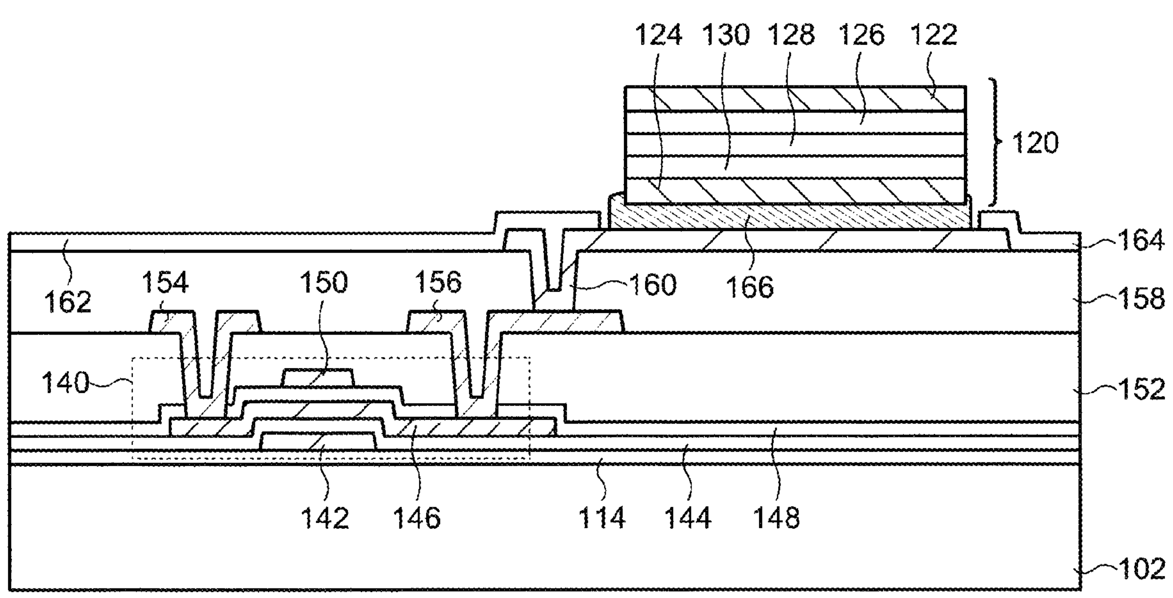
FIG. 3B is a schematic cross-sectional view of a sub-pixel of a display device according to an embodiment of the present invention.

Although the LED 120 shown in FIG. 3A has the anode 122 and the cathode 124 on one side, it is not always necessary for the LED 120 to have such a structure. For example, as shown in FIG. 3B, the LED 120 having a structure in which the p-type cladding layer 126, the active layer 128, and the n-type cladding layer 130 are sandwiched by the anode 122 and the cathode 124 may be used. In this case, a constant potential is supplied to the anode 122 by a wiring which is not illustrated.

3. MANUFACTURING METHOD OF DISPLAY DEVICE

The display device 100 is manufactured by placing the LED 120 over the backplane substrate and electrically connecting the LED 120 to the pixel electrode 160 and the common electrode 162. Hereinafter, a specific explanation is provided using FIG. 4A to FIG. 13B. In these drawings, the detailed configuration of the LED 120 and the backplane substrate may not be illustrated. Note that, since the backplane substrate including the substrate 102 provided with the pixel circuits can be formed by applying known materials and methods, the description thereof is omitted.

(1) Fabrication of LED

Figure 4A:
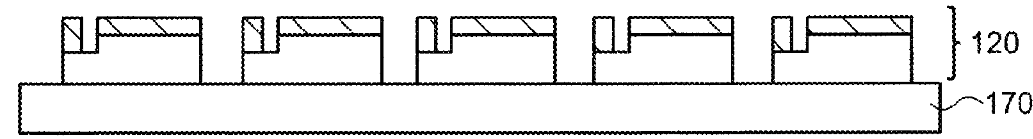
FIG. 4A is a schematic cross-sectional view showing a manufacturing method of a display device according to an embodiment of the present invention.

Since the LED 120 can be fabricated by known methods, a detailed description is omitted. For example, as shown in FIG. 4A, a film of compound semiconductors is epitaxially grown on a base substrate 170 such as a single crystal silicon substrate or sapphire substrate to form the n-type cladding layer 130, the active layer 128, and the p-type cladding layer 126. Then, the cathode 124 and the anode 122 are respectively formed over the n-type cladding layer 130 and the p-type cladding layer 126, thereby fabricating the plurality of LEDs 120 over one base substrate 170.

(2) Transfer of LEDs Onto Carrier Substrate (a) First Transfer

Figure 4B:
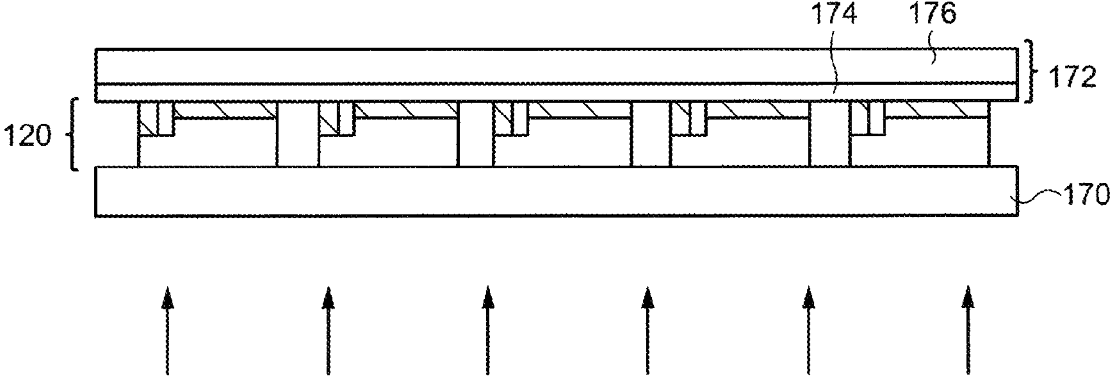
FIG. 4B is a schematic cross-sectional view showing a manufacturing method of a display device according to an embodiment of the present invention.

After the LEDs 120 are fabricated, the LEDs 120 over the base substrate 170 are transferred onto the backplane substrate. Specifically, a first carrier substrate 172 is first bonded onto the base substrate 170 (FIG. 4B). The first carrier substrate 172 is also called a dicing film or a dicing sheet and may include a base layer 176 and an adhesive layer 174. The base layer 176 may be a less flexible substrate exemplified by a quartz substrate, a glass substrate, or a metal substrate such as a stainless steel substrate, or may be a flexible substrate (film) including a polyester such as poly(ethylene terephthalate) and poly(ethylene naphthalate), nylon, a polycarbonate, a polyolefin such as polyethylene, polypropylene, and polystyrene, a cycloolefin polymer containing a polynorbornene as a fundamental skeleton, and a ring-opening metathesis polymerization polymer of norbornenes. On the other hand, the adhesive layer 174 may include polyolefin-based elastomer, polystyrene-based elastomer, poly(vinyl chloride)-based elastomer, polyurethane-based elastomer, polyester-based elastomer, polyacrylonitrile-based elastomer, polyamide-based elastomer, and the like. More specifically, the adhesive layer 174 may include styrene-butadiene rubber, isobutylene-isoprene rubber, ethylene-propylene-diene rubber, nitrile rubber, butadiene rubber, isoprene rubber as well as silicone rubber and natural rubber. The adhesive layer 174 may be a water-soluble adhesive.

Figure 4C:
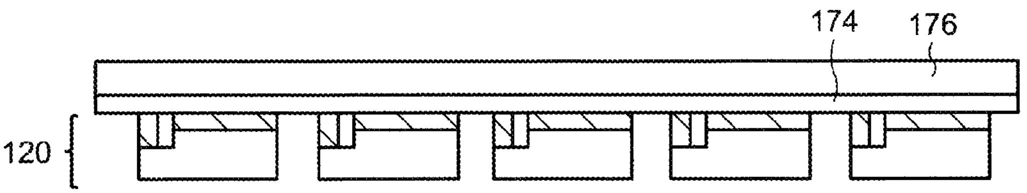
FIG. 4C is a schematic cross-sectional view showing a manufacturing method of a display device according to an embodiment of the present invention.

After that, light having a wavelength passing through the base substrate 170 and absorbed by the n-type cladding layer 130 is applied from the base substrate 170 side (FIG. 4B). For example, a laser having a wavelength selected from the range of 200 nm to 370 nm is applied. As a laser, a pulse-oscillated high-density KrF excimer laser, a YAG laser doped with Nd ions, and the like may be utilized. When the n-type cladding layer 130 absorbs light and generates heat, the n-type cladding layer 130 partially decomposes and vaporizes, resulting in a reduction in adhesion between the n-type cladding layer 130 and the base substrate 170. Thus, the base substrate 170 can be removed leaving the LEDs 120 over the first carrier substrate 172 (FIG. 4C).

When the LEDs 120 are transferred from the base substrate 170 onto the first carrier substrate 172, the arrangement of the LEDs 120 over the base substrate 170 is directly reproduced over the first carrier substrate 172. This arrangement may differ from the arrangement of the LEDs 120 over the backplane substrate. More specifically, a distance between adjacent LEDs 120 over the backplane substrate (or the pitch of the LEDs 120) may be different from that over the base substrate 170. Hence, the first carrier substrate 172 may be stretched appropriately to adjust the distance between adjacent LEDs 120 in order to conform to the LED 120 arrangement required over the backplane substrate.

(b) Second Transfer

In the case where the anode 122 and the cathode 124 of the LED 120 are provided on the same side (see FIG. 3A), the anode 122 and cathode 124 are located on the first carrier substrate 172 side when the LEDs 120 are transferred from the base substrate 170 onto the first carrier substrate 172. Therefore, if the LEDs 120 transferred onto the first carrier substrate 172 are directly transferred onto the backplane substrate, the LEDs 120 cannot be electrically connected to the backplane substrate.

Figure 5A:
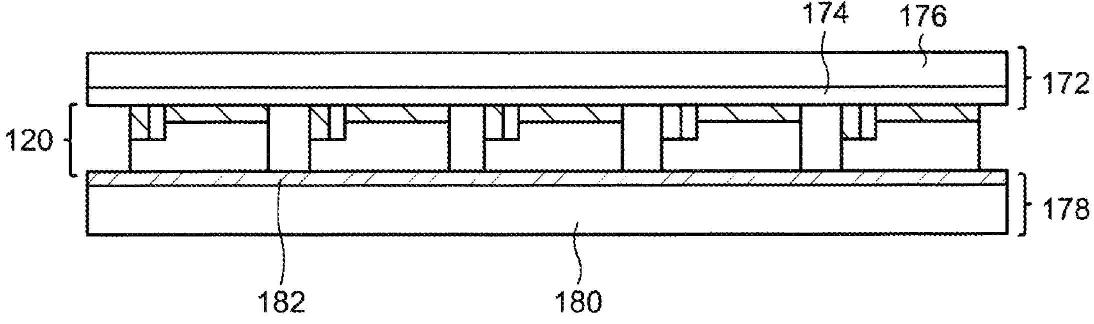
FIG. 5A is a schematic cross-sectional view showing a manufacturing method of a display device according to an embodiment of the present invention.
Figure 5B:
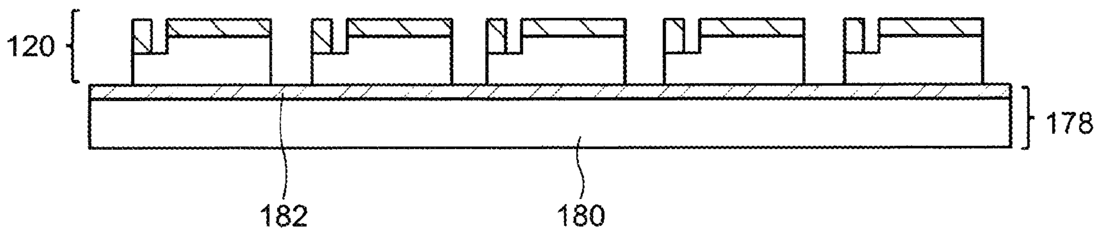
FIG. 5B is a schematic cross-sectional view showing a manufacturing method of a display device according to an embodiment of the present invention.

Therefore, in this case, a second transfer is performed. Specifically, as shown in FIG. 5A, a second carrier substrate 178 with a base layer 180 and an adhesive layer 182 is bonded to the first carrier substrate 172 so that the adhesive layer 182 and the LEDs 120 are sandwiched between the first carrier substrate 172 and the second carrier substrate 178. The first carrier substrate 172 is then removed so that the LEDs 120 remain over the second carrier substrate 178 to transfer the LEDs 120 onto the second carrier substrate 178 (FIG. 5B).

The base layer 180 may include materials that can be used in the base layer 176 of the first carrier substrate 172. The adhesive layer 182 may also include the materials which can be used in the adhesive layer 174 of the first carrier substrate 172. However, it is preferred to select the material of the adhesive layer 182 so as to bond more tightly to the LEDs 120 than the adhesive layer 174 in order to allow the LEDs 120 to selectively remain on the second carrier substrate 178. Alternatively, the anode 122 and the cathode 124 may be heated by applying light (e.g., light or laser having a wavelength in the range of 400 nm to 3000 nm) from the first carrier substrate 172 side or the second carrier substrate 178 side to decompose a part of the adhesive layer 174 in contact with the anode 122 and the cathode 124, thereby reducing the adhesive strength of the adhesive layer 174. Alternatively, a water-soluble adhesive may be used for the adhesive layer 174, and the transfer may be performed by reducing its adhesive strength using water. The distance between the LEDs 120 may be adjusted by stretching the second carrier substrate 178.

Figure 6A:
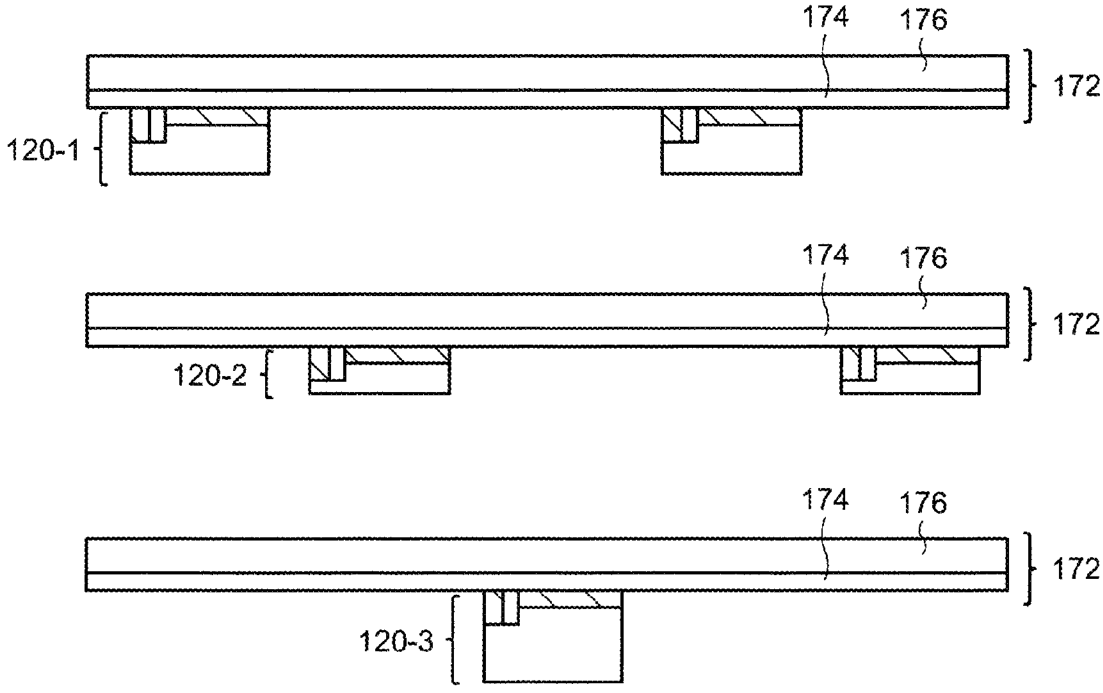
FIG. 6A is a schematic cross-sectional view showing a manufacturing method of a display device according to an embodiment of the present invention.
Figure 6B:
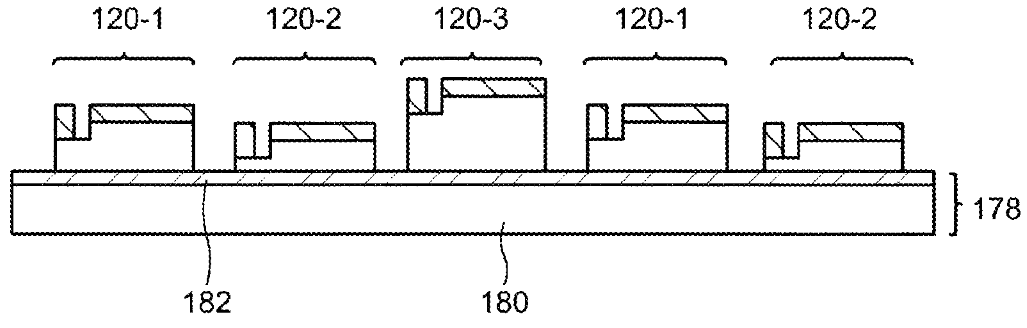
FIG. 6B is a schematic cross-sectional view showing a manufacturing method of a display device according to an embodiment of the present invention.

Usually, a plurality of LEDs 120 having the same structure is formed over each base substrate 170. That is, the LEDs 120 providing the same emission color are formed over one base substrate 170. Therefore, the LEDs 120 are transferred from three base substrates 170 over which the red-, green-, and blue-emissive LEDs 120-1 to 120-3 are respectively formed onto three first carrier substrates 172, respectively (FIG. 6A). After that, the LEDs 120 over three first carrier substrates 172 may be transferred onto one second carrier substrate 178, and then the red-, green-, and blue-emissive LEDs 120-1 to 120-3 may be transferred onto the second carrier substrate 178 (FIG. 6B).

(3) Arrangement of Spacer

Figure 7A:
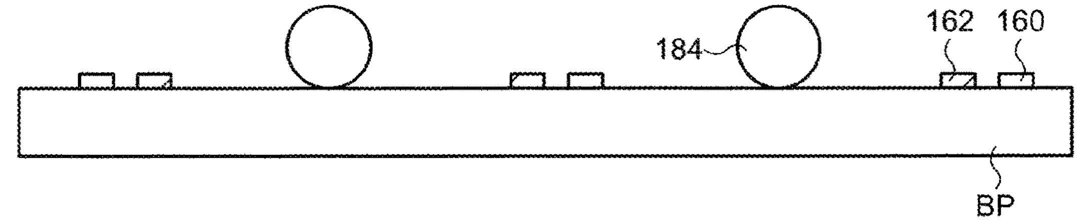
FIG. 7A is a schematic cross-sectional view showing a manufacturing method of a display device according to an embodiment of the present invention.

Next, the bumps 166 are formed over the pixel electrode 160 and the common electrode 162. The bumps 166 are formed over the portions of the pixel electrode 160 and the common electrode 162 exposed from the protective insulating film 164. Then, the LEDs 120 which have been transferred onto the second carrier substrate 178 are transferred onto the backplane substrate. At this time, a plurality of spacers 184 is arranged over the backplane substrate in order to ensure a more reliable transfer of the LEDs 120 (FIG. 7A). That is, the plurality of spacers 184 is arranged over the protective insulating film 164 (see FIG. 3A) so as to be in contact with the protective insulating film 164. The spacers 184 are configured to be elastically deformed. Thus, the spacers 184 include elastic materials such as styrene-butadiene rubber, isobutylene-isoprene rubber, ethylene-propylene-diene rubber, nitrile rubber, butadiene rubber, isoprene rubber, silicone rubber, and natural rubber.

The spacer 184 may be configured to transmit or absorb visible light so as to reflect as little emission from the LEDs 120 as possible. In the latter case, the surface of the spacer 184 containing the aforementioned materials may be coated with a black resin or a metallic film with low reflectance such as chromium.

One preferred shape of the spacer 184 is a spherical shape. In this case, the shape of the spacer 184 may be adjusted to have an average circularity equal to or greater than 80. Formation of the spacer 184 having a spherical shape allows the spacer 184 to have substantially the same height over the backplane substrate regardless of its rotation. Here, the circularity is a value obtained by analyzing images obtained by microscopic observation of the spacers 184 and determining and averaging the circularity of the plurality of spacers 184. For example, the circularity may be calculated by dividing the perimeter of a circle with an area equal to the area of the projected surface of each spacer 184 in the microscope image by the perimeter of the projected surface. The diameter of the spacer 184 may be greater than the summation of the height of the LED 120 to be transferred and the height of the bump 166, and the difference therebetween is preferred to be equal to or more than 0.5 μm and equal to or less than 5 μm. Specifically, the diameter of the spacer 184 may be adjusted in a range equal to or more than 3 μm and equal to or less than 20 μm.

Figure 8:
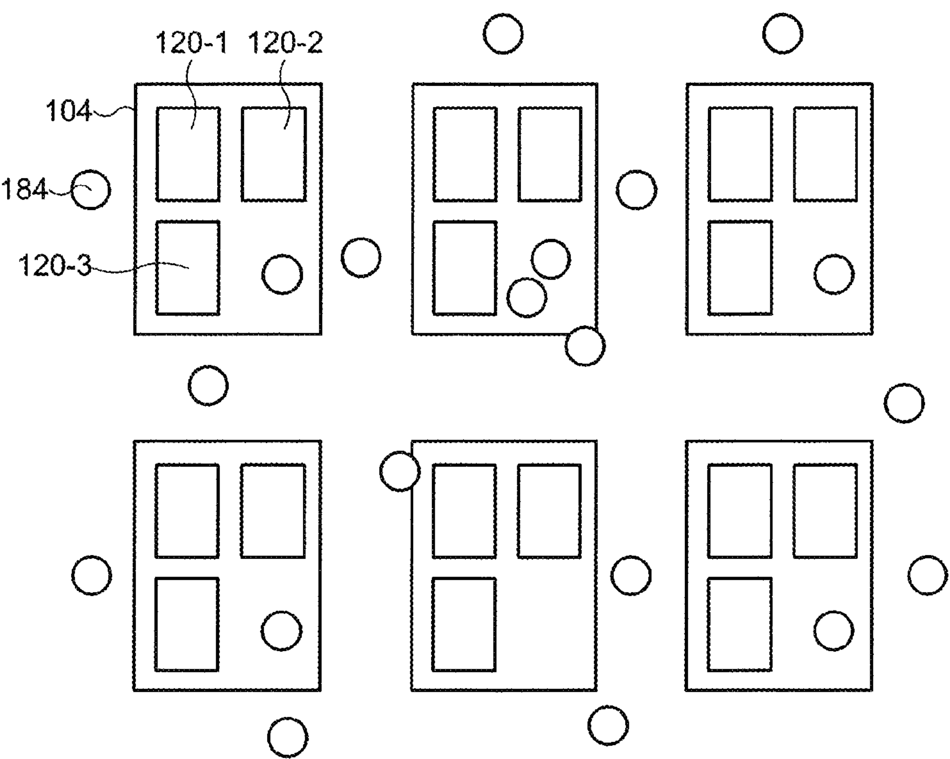
FIG. 8 is a schematic top view showing a manufacturing method of a display device according to an embodiment of the present invention.

The spherical spacers 184 may be arranged by directly spraying powdery spacers 184 or by dropping, spraying, or applying a dispersion of the spacers 184 dispersed in a liquid such as water and an alcohol-based solvent exemplified by ethanol, isopropyl alcohol, and the like. The spacers 184 may be randomly arranged over the backplane substrate as schematically shown in FIG. 8. In addition, the spacers 184 may be sprayed so as to partly exist in the display region or the pixel 104. Note that the spacers 184 are arranged so as not to overlap the pixel electrodes 160 and the common electrodes 162. If the spacer 184 overlaps the pixel electrode 160 or the common electrode 162, the backplane substrate may be vibrated to move the spacer 184 away from the pixel electrode 160 or the common electrode 162, for example.

Figure 9A:
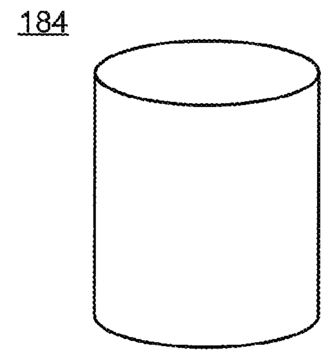
FIG. 9A is a schematic perspective view of a spacer used in a manufacturing method of a display device according to an embodiment of the present invention.
Figure 9B:
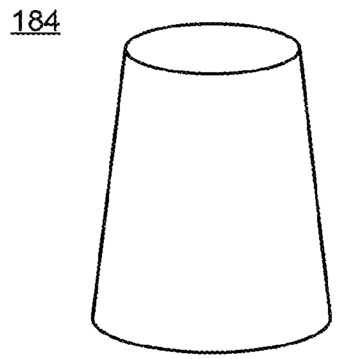
FIG. 9B is a schematic perspective view of a spacer used in a manufacturing method of a display device according to an embodiment of the present invention.
Figure 9C:
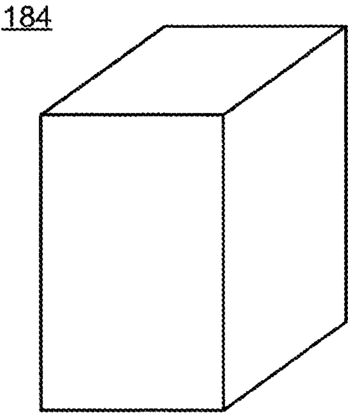
FIG. 9C is a schematic perspective view of a spacer used in a manufacturing method of a display device according to an embodiment of the present invention.

Another preferred shape of the spacer 184 is a columnar shape. For example, as shown in FIG. 9A to FIG. 9C, the spacer 184 may have a cylindrical or polygonal columnar shape and may further be configured so that the cross-sectional area (the area in a plane parallel to the substrate 102) increases as it approaches the substrate 102. Although not illustrated, the spacer 184 may have an elliptical columnar shape. The columnar-shaped spacer 184 is preferred to be formed so that its height is greater than the summation of the height of the LED 120 and the height of the bump 166, and the difference therebetween is equal to or larger than 0.5 μm and equal to or less than 5 μm. Specifically, the height of the spacer 184 may be adjusted in the range equal to or larger than 3 μm and equal to or less than 20 μm.

Figure 10A:
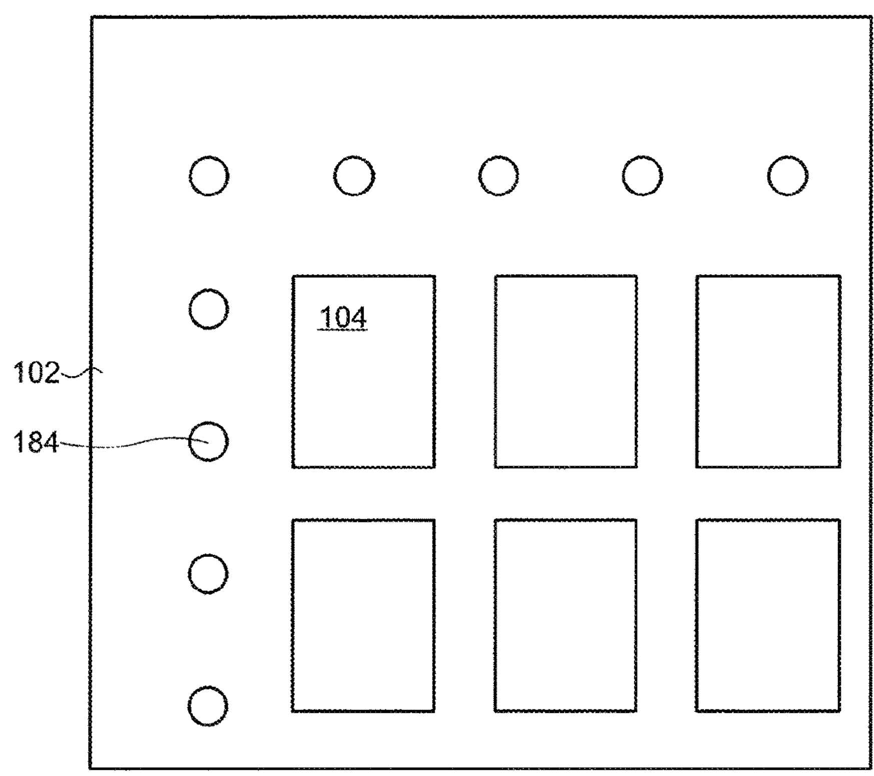
FIG. 10A is a schematic top view showing a manufacturing method of a display device according to an embodiment of the present invention.
Figure 10B:
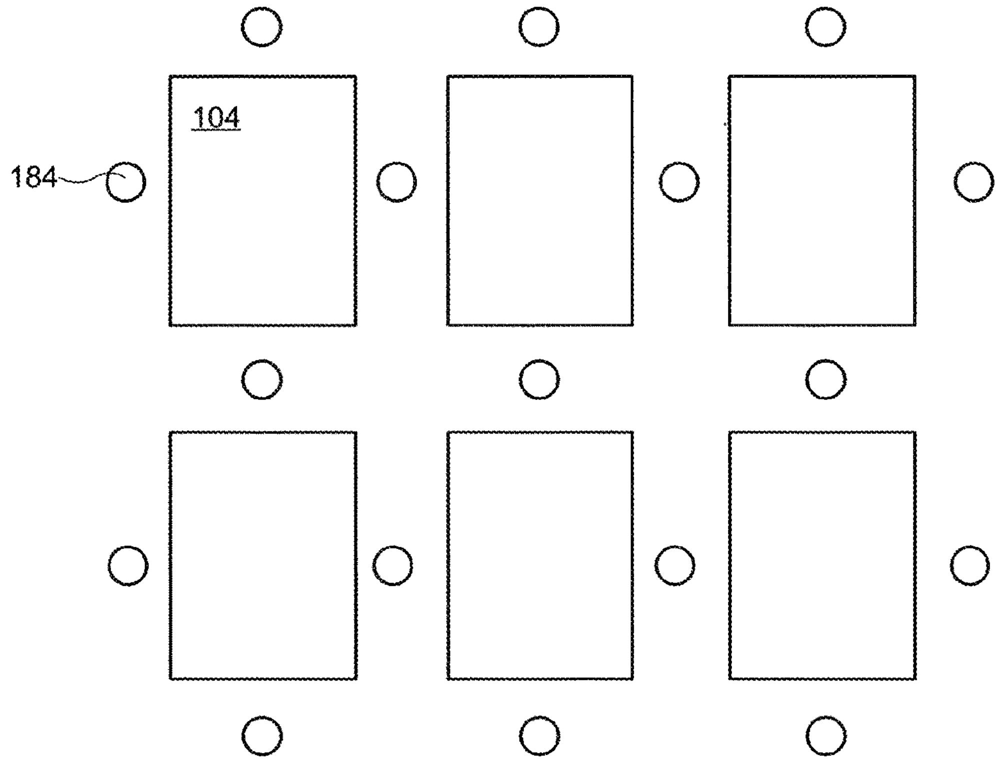
FIG. 10B is a schematic top view showing a manufacturing method of a display device according to an embodiment of the present invention.
Figure 11:
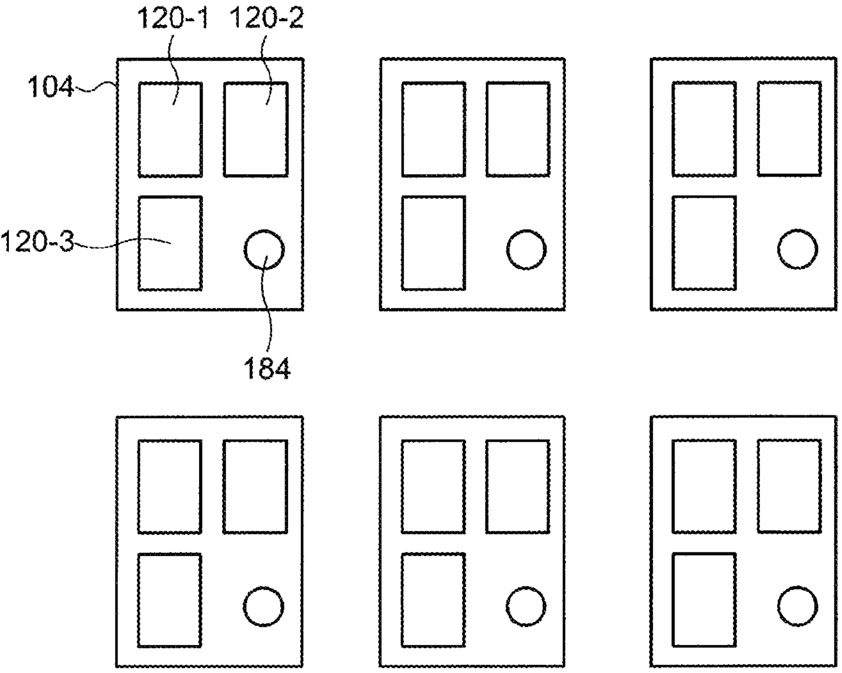
FIG. 11 is a schematic top view showing a manufacturing method of a display device according to an embodiment of the present invention.

When providing the columnar-shaped spacers 184, one of the preferred fabrication methods of the spacers 184 is photolithography. This is because, unlike the spherical spacers 184, the columnar-shaped spacers 184 have different heights depending on the extending angle over the backplane substrate (or protective insulating film 164), and the formation of the spacers 184 using photolithography allows the fabrication of the spacers 184 with a constant height. Specifically, the columnar-shaped spacers 184 can be fabricated by forming a photoresist over the protective insulating film 164, followed by performing light exposure through a photomask and development. Therefore, appropriate design of the photoresist allows the spacers 184 to be precisely placed over and fixed to the protective insulating film 164. In addition, the spacers 184 can be placed at a constant pitch. For example, as shown in FIG. 10A, the spacers 184 may be selectively placed outside the display region to surround all of the pixels 104. Alternatively, the plurality of spacers 184 may be arranged to surround each pixel 104 (FIG. 10B). Alternatively, one or more spacers 184 may be selectively placed in each pixel 104 as shown in FIG. 11.

Figure 12A:
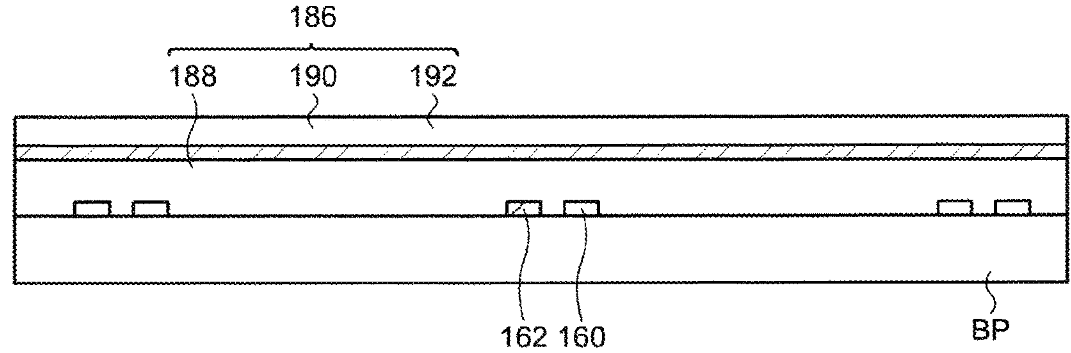
FIG. 12A is a schematic cross-sectional view showing a manufacturing method of a display device according to an embodiment of the present invention.
Figure 12B:
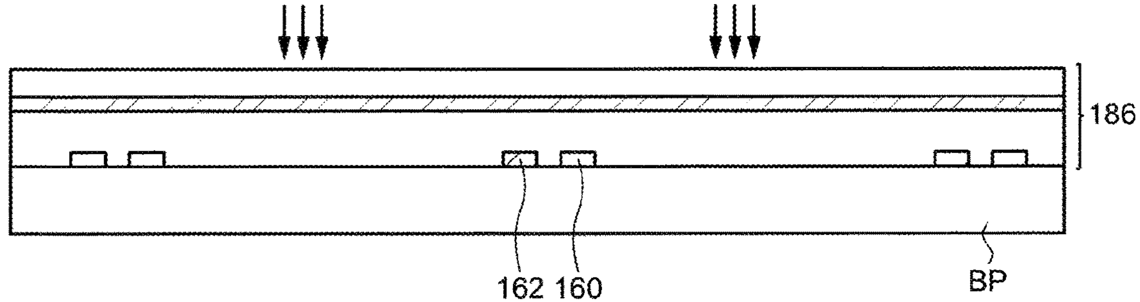
FIG. 12B is a schematic cross-sectional view showing a manufacturing method of a display device according to an embodiment of the present invention.
Figure 12C:
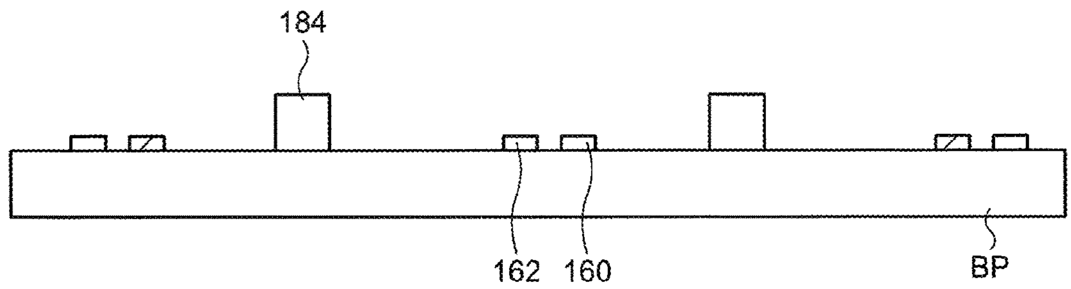
FIG. 12C is a schematic cross-sectional view showing a manufacturing method of a display device according to an embodiment of the present invention.

Another preferred method of fabricating the columnar-shaped spacers 184 is a transfer method. In this method, a spacer-transfer substrate 186 in which a base layer 192, a photothermal conversion layer 190, and a transfer layer 188 are stacked is first arranged over the backplane substrate (FIG. 12A). The base layer 192 includes, for example, glass or quartz. The photothermal conversion layer 190 is a layer which generates heat when irradiated with light, and a film in which carbon black is dispersed in a polymeric material such as a polyester or a polycarbonate may be used, for example. The transfer layer 188 is composed of the material included in the spacer 184 described above. The area where the spacer 184 is to be formed is then irradiated with light such as a laser exemplified by a YAG laser, a Nd laser, a $CO_2$ laser, or the like (FIG. 12B), by which the photothermal conversion layer 190 is selectively heated in the area irradiated with the laser. The transfer layer 188 is melted by this heat and is transferred onto the backplane substrate, resulting in the spacers 184. The use of the transfer method also allows the arrangement of the spacers 184 at a constant pitch.

(4) Transfer of LEDs to Backplane Substrate

Figure 7B:
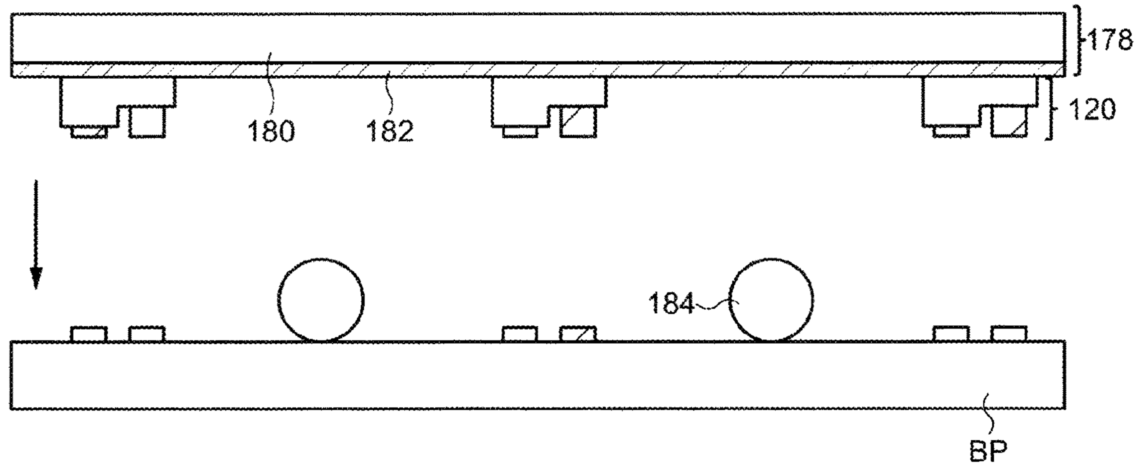
FIG. 7B is a schematic cross-sectional view showing a manufacturing method of a display device according to an embodiment of the present invention.
Figure 7C:
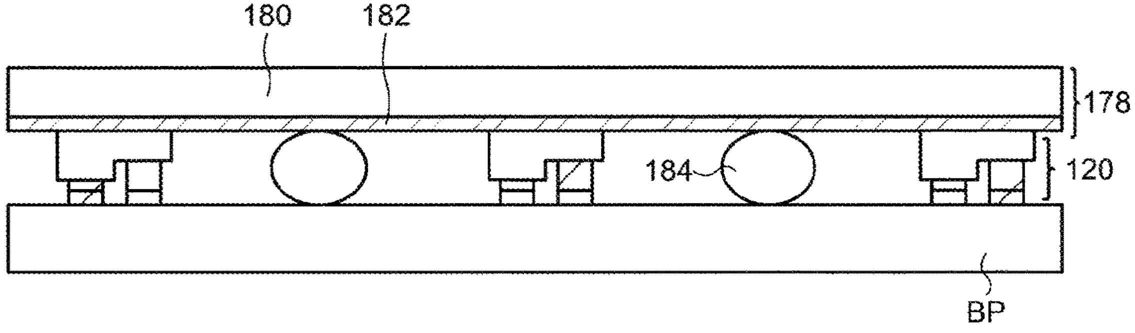
FIG. 7C is a schematic cross-sectional view showing a manufacturing method of a display device according to an embodiment of the present invention.

After arranging the spacers 184, the backplane substrate and the second carrier substrate 178 are bonded to each other (FIG. 7B and FIG. 7C). Specifically, the substrate 102 and the second carrier substrate 178 are pressed against each other so that the pixels formed over the substrate 102 and the LEDs 120 over the second carrier substrate 178 are sandwiched between the substrate 102 and the second carrier substrate 178. At this time, since the substrate 102 and the second carrier substrate 178 are sandwiched between a pair of stages which is not illustrated and are applied with pressure, an auxiliary substrate (not illustrated) with sufficient rigidity may be placed under the substrate 102 and/or over the second carrier substrate 178 and then the bonding may be carried out in the case where the substrate 102 and/or the base layer 180 of the second carrier substrate 178 is flexible. The backplane substrate and the second carrier substrate 178 are aligned so that the anode 122 and cathode 124 of the LED 120 are electrically connected to the common electrode 162 and pixel electrode 160, respectively, when the bonding is carried out.

Furthermore, in the bonding process, pressure is applied to the substrate 102 and the second carrier substrate 178 so that the elastically deformable spacers 184 are deformed (FIG. 7C). Thus, when the spherical spacers 184 are used, for example, the spacers 184 deform to an ellipsoidal shape during bonding. In addition, the anode 122 and the cathode 124 may be heated by applying light (e.g., light or laser having wavelengths in the range equal to or longer than 400 nm and equal to or shorter than 3000 nm) from the second carrier substrate 178 side to melt a part of or the whole of the bumps 166 in order to ensure that the anode 122 and the cathode 124 are electrically connected to the common electrode 162 and the pixel electrode 160, respectively, via the bumps 166. When the bumps 166 solidify again, the anode 122 and the cathode 124 are firmly fixed to the common electrode 162 and the pixel electrode 160, respectively.

Figure 13A:
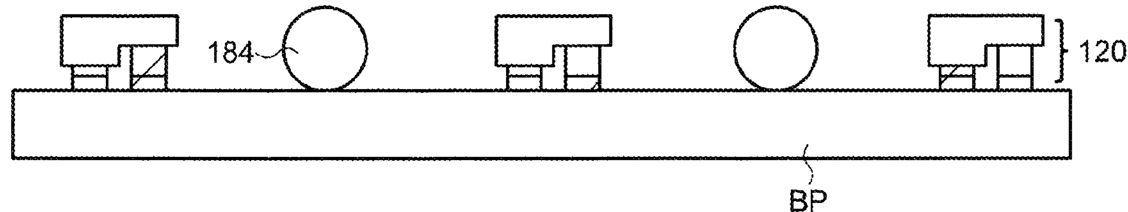
FIG. 13A is a schematic cross-sectional view showing a manufacturing method of a display device according to an embodiment of the present invention.

After that, the second carrier substrate 178 is removed and the LEDs 120 are selectively left over the backplane substrate, thereby producing the display device 100 (FIG. 13A). Note that the spacers 184 may be left over the backplane substrate. In this case, the display device 100 includes the spacers 184 over and in contact with the protective insulating film 164.

Figure 13B:
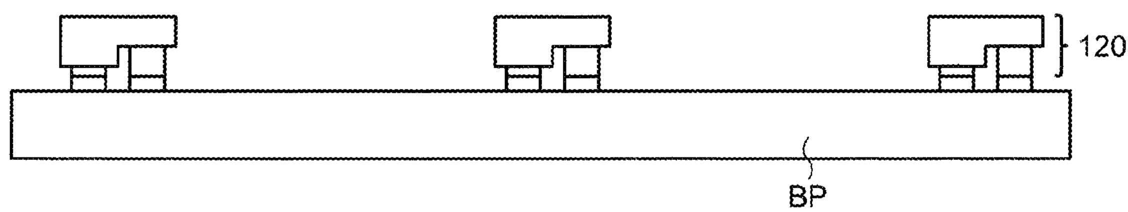
FIG. 13B is a schematic cross-sectional view showing a manufacturing method of a display device according to an embodiment of the present invention.
Figure 14A:
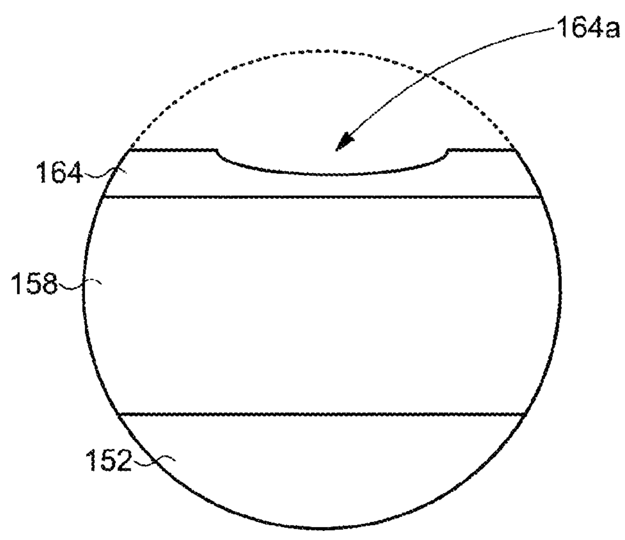
FIG. 14A is a schematic cross-sectional view of a portion of a pixel of a display device according to an embodiment of the present invention.
Figure 14B:
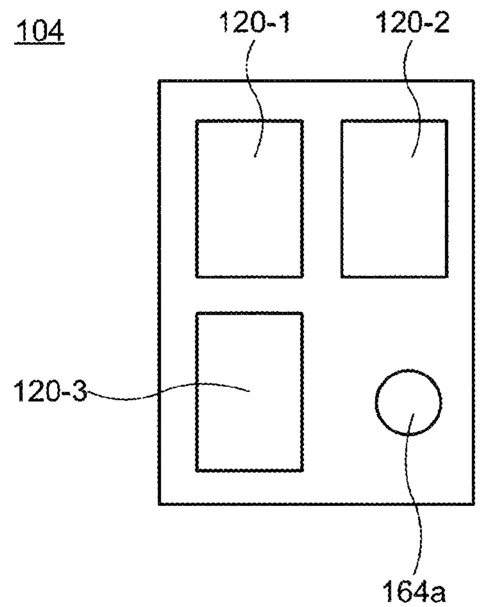
FIG. 14B is a schematic top view of a portion of a pixel of a display device according to an embodiment of the present invention.

When the spherical spacers 184 are arranged by being sprayed over the backplane substrate, the spacers 184 may be removed by a cleaning process using water, an alcohol-based organic solvent, or the like (FIG. 13B). In this case, the protective insulating film 164 may be deformed by the pressure applied to the spacers 184 during the bonding process. Therefore, as shown in the schematic cross-sectional view of the area surrounded by the dotted circle in FIG. 3 (FIG. 14A) and the corresponding schematic top view (FIG. 14B), the protective insulating film 164 may have a recessed portion 164*a* caused by the spacer 184. The planar shape of the recessed portion 164*a* is, for example, a circle.

In the transfer of the LEDs 120, it is necessary to respectively connect the anode 122 and the cathode 124 to the common electrode 162 and the pixel electrode 160 electrically and reliably. However, there may be in-plane variations in the thickness of the substrate 102 included in the backplane substrate, and it is not always easy to form the bumps 166 at a constant height. Furthermore, in-plane variations in the thickness of the adhesive layer 182 and the amount of sinkage of the LEDs 120 into the adhesive layer 182 are also not constant. In addition, the LEDs 120 may tilt in the first transfer and/or the second transfer. Moreover, as described above, when the LEDs 120 with different emission colors are arranged over the second carrier substrate 178, the height of the LEDs 120 may vary depending on the emission color (see FIG. 6B). Furthermore, the stages used to apply pressure during the bonding process may not necessarily have high flatness, and it is also not easy to apply pressure to the second carrier substrate 178 and the backplane substrate with a pair of stages in a completely parallel state.

Figure 15A:
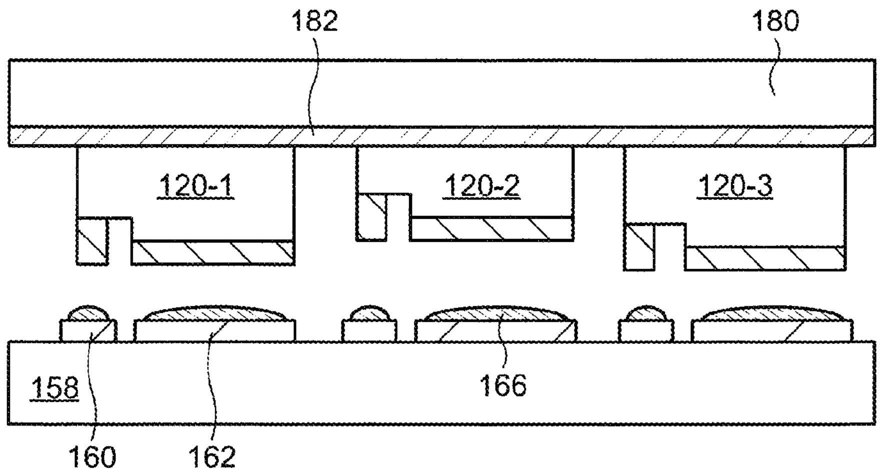
FIG. 15A is a schematic cross-sectional view showing a manufacturing method of a conventional display device.
Figure 15B:
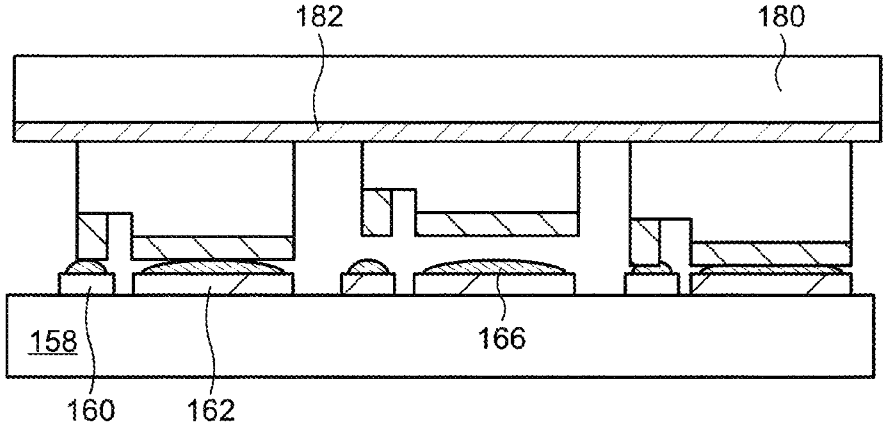
FIG. 15B is a schematic cross-sectional view showing a manufacturing method of a conventional display device.
Figure 15C:
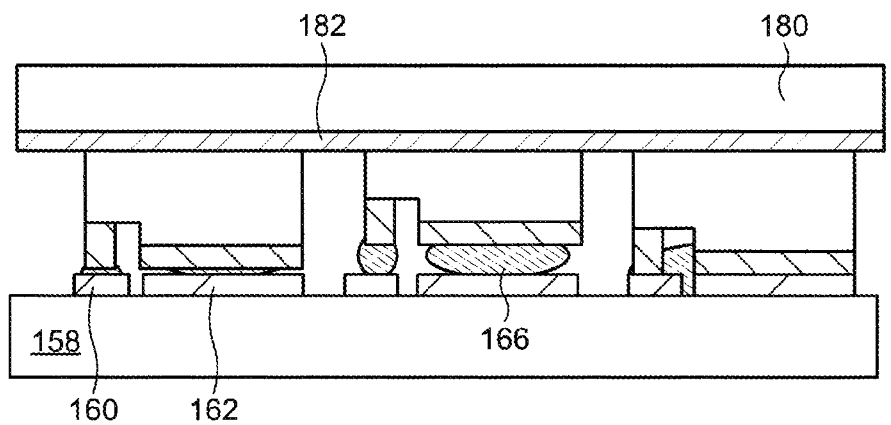
FIG. 15C is a schematic cross-sectional view showing a manufacturing method of a conventional display device.

Therefore, when the heights of the LEDs 120 are different as shown in FIG. 15A, for example, a part of the LEDs 120 may not be able to make contact with the bump 166 during the bonding process and may not be electrically connected to the pixel electrode 160 or the common electrode 162 (FIG. 15B). On the contrary, the distance between a part of the LEDs 120 and the pixel electrode 160 or the common electrode 162 may become extremely small, which may allow the conductive bump 166 to flow between the anode 122 and the cathode 124, resulting in a short circuit of the anode 122 and the cathode 124 (FIG. 15C).

In order to avoid the above-mentioned problems, it is necessary to maintain an appropriate distance between the backplane substrate and the second carrier substrate 178 while applying sufficient pressure during the bonding process. In the manufacturing method of the display device according to an embodiment of the present invention, the spacers 184 capable of being elastically deformed during the bonding process are provided between the backplane substrate and the second carrier substrate 178 as described above. Hence, it is possible to appropriately maintain the distance between the backplane substrate and the second carrier substrate 178 even when the backplane substrate and the second carrier substrate 178 are pressed against each other with a large pressure to ensure that all of the LEDs 120 are electrically connected to the pixel electrode 160 and the common electrode 162. Even if the substrate 102, the first carrier substrate 172, and/or the second carrier substrate 178 is deflected, the deflection can be corrected because a large pressure is available. In addition, even if the parallelism and flatness of the stages are low, bonding can be performed while absorbing the low parallelism and flatness. Furthermore, even when the first carrier substrate 172 or the second carrier substrate 178 with a large area is used, a large number of LEDs 120 can be transferred in a single transfer because a large pressure can be applied over the entire area of these substrates. Since the features described above contribute to improved manufacturing yield and lower manufacturing costs, a LED display can be provided at a lower cost by implementing the embodiment of the present invention.

4. MODIFIED EXAMPLES OF MANUFACTURING METHOD OF DISPLAY DEVICE

(1) Modified Example 1

As described above, the height (thickness) of the LED 120 may vary depending on the emission color (see FIG. 6B). Therefore, when mounting the plurality of LEDs 120 with different heights in the display device 100, the spacers 184 with different sizes may be used in the transfer process according to the heights of the LEDs 120.

Figure 16A:
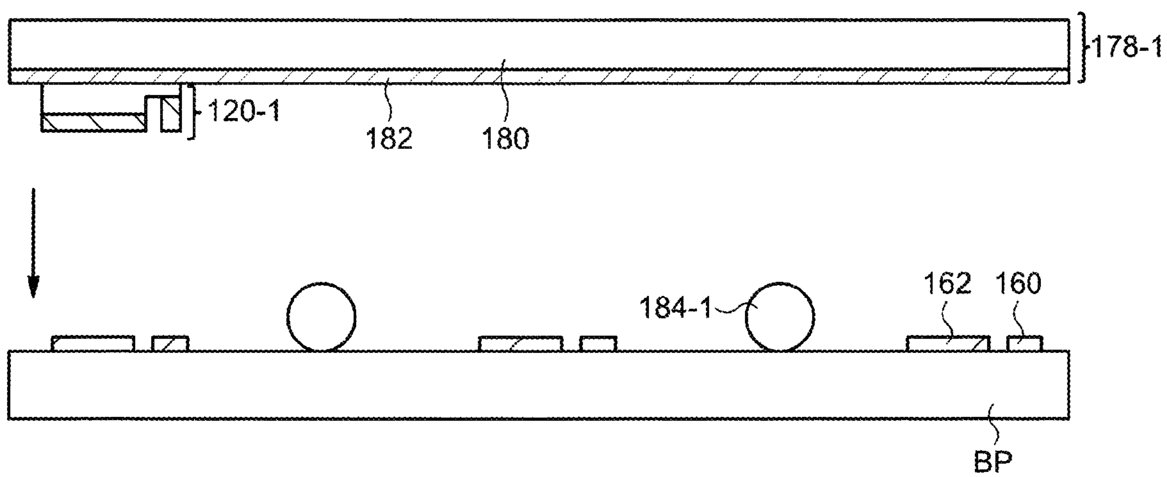
FIG. 16A is a schematic cross-sectional view showing a manufacturing method of a display device according to an embodiment of the present invention.
Figure 16B:
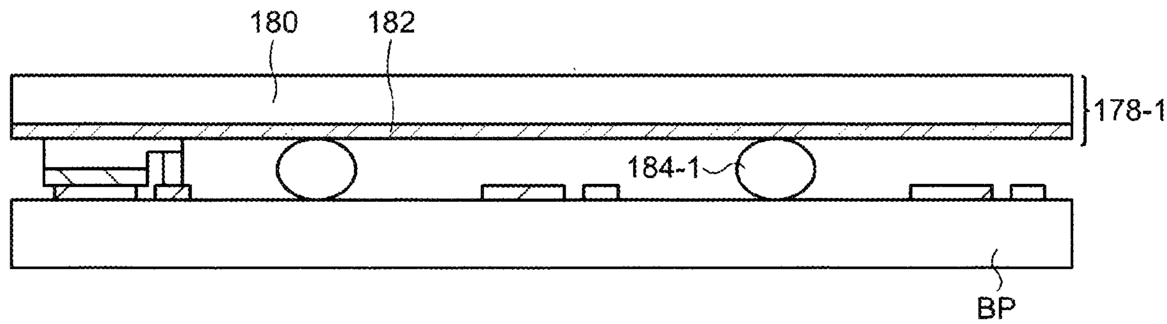
FIG. 16B is a schematic cross-sectional view showing a manufacturing method of a display device according to an embodiment of the present invention.

Specifically, when the height increases in the order of the LED 120-1, the LED 120-2, and the LED 120-3, the backplane substrate over which the spacers 184-1 are arranged and the second carrier substrate 178-1 onto which the LEDs 120-1 with the smallest height have been transferred are prepared and bonded to each other so that the LEDs 120-1 and the spacers 184-1 are sandwiched between the second carrier substrate 178-1 and the backplane substrate as shown in FIG. 16A and FIG. 16B. Since the spacers 184-1 are deformed by the pressure applied to the second carrier substrate 178-1 and the backplane substrate during the bonding process, a large pressure can be applied, while appropriately maintaining the distance between the second carrier substrate 178-1 and the backplane substrate. As a result, the LEDs 120-1 can be reliably fixed to the pixel electrodes 160 and the common electrodes 162. The second carrier substrate 178-1 and the spacers 184-1 are then removed while leaving the LEDs 120-1 over the backplane substrate.

Figure 16C:
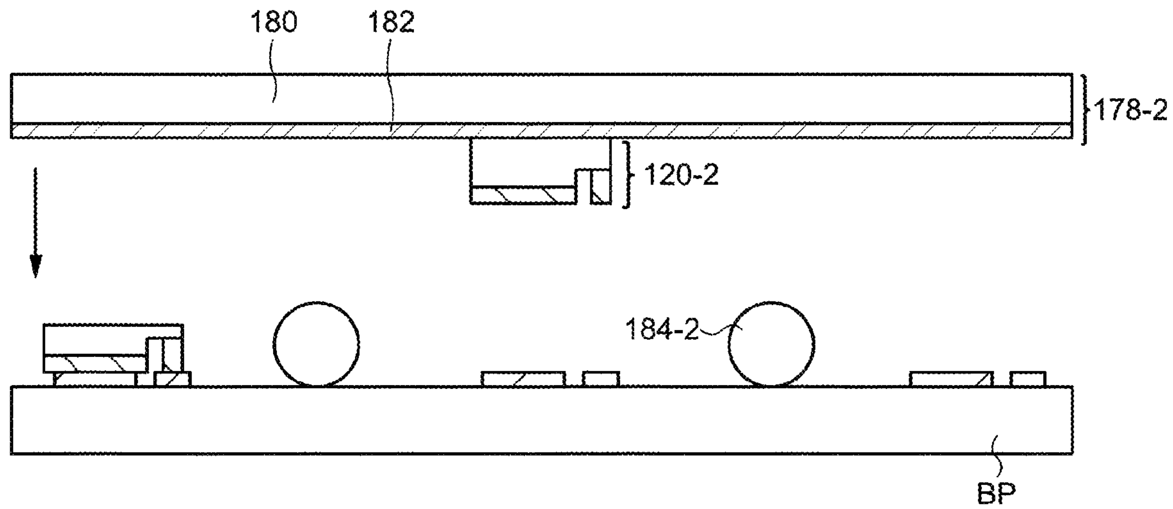
FIG. 16C is a schematic cross-sectional view showing a manufacturing method of a display device according to an embodiment of the present invention.
Figure 17A:
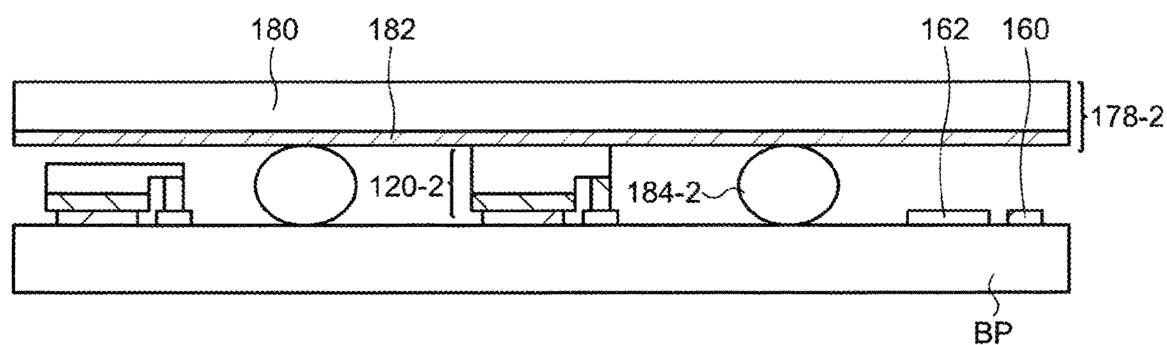
FIG. 17A is a schematic cross-sectional view showing a manufacturing method of a display device according to an embodiment of the present invention.

Next, the second carrier substrate 178-2 onto which the LEDs 120-2 have been transferred is bonded to the backplane substrate (FIG. 16C, FIG. 17A). At this time, the spacers 184-2 larger than the spacers 184-1 are used. Since the LEDs 120-1 are smaller in height than the LEDs 120-2, the spacers 184-2 are deformed without any interference between the carrier substrate 178-2 and the LEDs 120-1 even if pressure is applied during the bonding process. Therefore, the LEDs 120-2 are reliably fixed to the pixel electrodes 160 and the common electrodes 162.

Figure 17B:
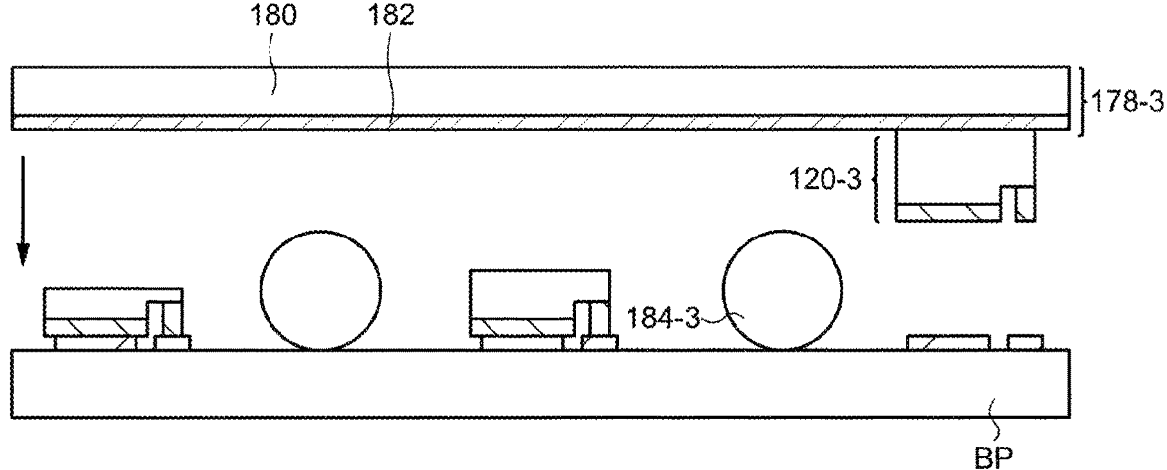
FIG. 17B is a schematic cross-sectional view showing a manufacturing method of a display device according to an embodiment of the present invention.
Figure 17C:
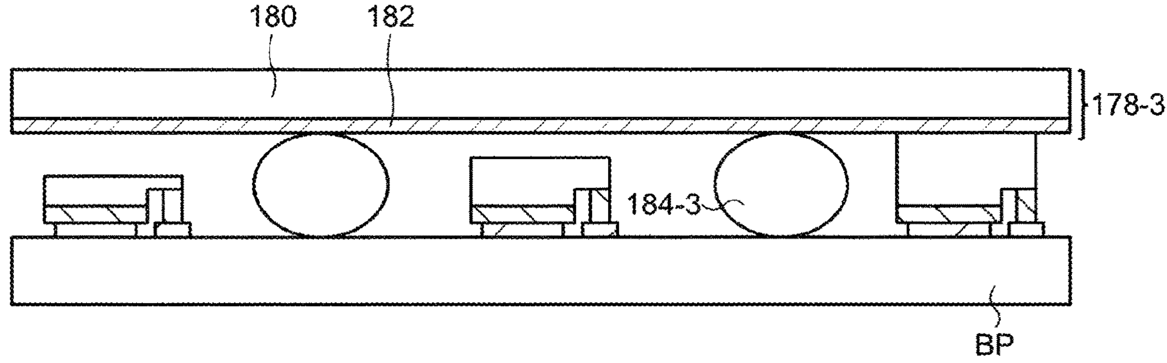
FIG. 17C is a schematic cross-sectional view showing a manufacturing method of a display device according to an embodiment of the present invention.
Figure 18:
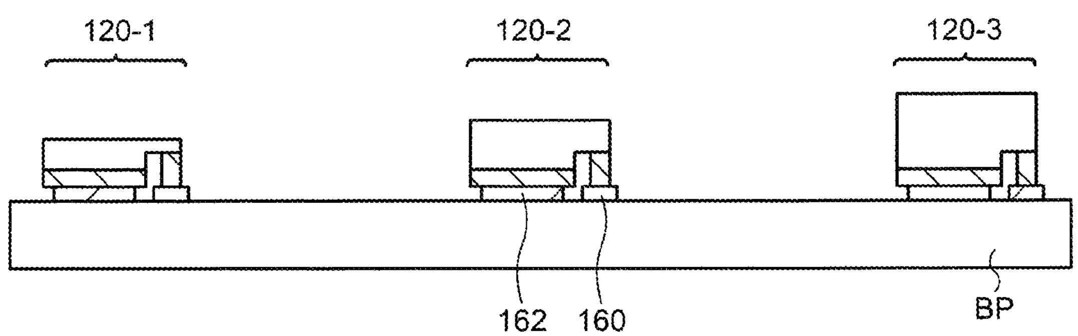
FIG. 18 is a schematic cross-sectional view showing a manufacturing method of a display device according to an embodiment of the present invention.

Similarly, the second carrier substrate 178-3 onto which the LEDs 120-3 have been transferred is then bonded to the backplane substrate (FIG. 17B, FIG. 17C). At this time, since the spacers 184-3 larger than the spacers 184-2 are used, the spacers 184-3 are deformed by the pressure during the bonding process without any interference between the second carrier substrate 178-2 and the LEDs 120-1 and the LEDs 102-2. Hence, the LEDs 120-3 are reliably fixed to the pixel electrodes 160 and the common electrodes 162. After that, the spacers 184-3 and the second carrier substrate 178-3 are removed (FIG. 18).

As described above, a plurality of transfer processes is conducted in the order from the LEDs with a smaller height, and the size of the spacers 184 are increased in every transfer process, by which the plurality of LEDs 120 with different heights can be arranged on one backplane substrate. The preferred sizes of the spacers 184 are as described above. Therefore, it is also possible to arrange four or more kinds of LEDs 120 with different heights on the backplane substrate by this process.

(2) Modified Example 2

As described above, the LED 120 may have a structure in which the cathode 124 and the anode 122 sandwich the p-type cladding layer 126, the active layer 128, and the n-type cladding layer 130 (see FIG. 3B). In this case, since one of the electrodes is located on the opposite side of the first carrier substrate 172 even after the first transfer, the second transfer may not be carried out. Therefore, the LEDs 120 transferred onto the first carrier substrate 172 may be transferred onto the backplane substrate without using the second carrier substrate 178. Although a detailed explanation is omitted, similar to the manufacturing method described above, the plurality of spacers 184 is arranged over the backplane substrate, and the first carrier substrate 172 onto which the LEDs 120 have been transferred is bonded thereover. The bonding process is performed so that the pixels 104 and the LEDs 120 are sandwiched between the backplane substrate and the first carrier substrate 172, the plurality of spacers 184 are deformed, and the cathodes 124 and the anodes 122 of the LEDs 120 are electrically connected to the common electrodes 162 and the pixel electrodes 160, respectively. Pressure is then applied to the first carrier substrate 172 and the substrate 102 to press these substrates against each other. When the base layer 176 of the first carrier substrate 172 is not sufficiently rigid, an auxiliary substrate which is not illustrated may be provided over the first carrier substrate 172. Since the processes after this process are the same as those in the above manufacturing method, the explanation thereof is omitted.

In this modified example, since the LEDs 120 are also transferred after the plurality of spacers 184 is arranged, a sufficiently large pressure can be applied between the first carrier substrate 172 and the substrate 102 while maintaining an appropriate distance between the backplane substrate and the first carrier substrate 172. Therefore, the same effects as in the aforementioned manufacturing method can be obtained.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by each of the aforementioned embodiments is achieved by the present invention if the effect is obvious from the description in the specification or readily conceived by persons ordinarily skilled in the art.

What is claimed is:

1. A manufacturing method of a display device comprising:

transferring at least one inorganic light-emitting diode formed over a base substrate onto a first carrier substrate;

arranging a plurality of spacers configured to be elastically deformable over a substrate over which a pixel including a plurality of sub-pixels is arranged; and transferring the at least one inorganic light-emitting diode over the first carrier substrate onto the substrate, wherein the transfer of the at least one inorganic light-emitting diode over the first carrier substrate onto the substrate is performed by pressing the first carrier substrate and the substrate against each other so that the pixel and the at least one inorganic light-emitting diode are sandwiched by the first carrier substrate and the substrate, at least one of the plurality of spacers is deformed, and the at least one inorganic light-emitting diode is electrically connected to one of the plurality of sub-pixels, and removing the first carrier substrate to leave the at least one inorganic light-emitting diode spaced from the plurality of spacers over the substrate.

2. The manufacturing method according to claim 1, further comprising removing the plurality of spacers.

3. The manufacturing method according to claim 1, wherein the arrangement of the plurality of spacers is performed by spraying the plurality of spacers over the substrate.

4. The manufacturing method according to claim 1, wherein the plurality of spacers is formed by photolithography or a transfer method.

5. The manufacturing method according to claim 1, wherein the plurality of spacers has a spherical shape or a columnar shape.

6. The manufacturing method according to claim 1, wherein the at least one inorganic light-emitting diode includes a plurality of inorganic light-emitting diodes arranged in a display region defined over the substrate, and the plurality of spacers is arranged outside the display region.

7. The manufacturing method according to claim 1, wherein the plurality of spacers is arranged at a constant pitch.

8. The manufacturing method according to claim 1, wherein at least one of the plurality of spacers is arranged in the pixel.

9. The manufacturing method according to claim 1, wherein the at least one inorganic light-emitting diode includes a plurality of inorganic light-emitting diodes, and at least one of the plurality of inorganic light-emitting diodes is different in height from at least another one of the plurality of inorganic light-emitting diodes.

10. A manufacturing method of a display device, the manufacturing method comprising:

transferring at least one inorganic light-emitting diode formed over a base substrate onto a first carrier substrate;

transferring the at least one inorganic light-emitting diode over the first carrier substrate onto a second carrier substrate;

arranging a plurality of spacers configured to be elastically deformable over a substrate over which a pixel including a plurality of sub-pixels is arranged; and transferring the at least one inorganic light-emitting diode over the second carrier substrate onto the substrate, wherein the transfer of the at least one inorganic light-emitting diode over the second carrier substrate onto the substrate is performed by pressing the second carrier substrate and the substrate against each other so that the pixel and the at least one inorganic light-emitting diode are sandwiched by the second carrier substrate and the substrate, at least one of the plurality of spacers is deformed, and the at least one inorganic light-emitting diode is electrically connected to one of the plurality of sub-pixels, and removing the second carrier substrate to leave the at least one inorganic light-emitting diode spaced from the plurality of spacers over the substrate.

11. The manufacturing method according to claim 10, further comprising removing the plurality of spacers.

12. The manufacturing method according to claim 10, wherein the arrangement of the plurality of spacers is performed by spraying the plurality of spacers over the substrate.

13. The manufacturing method according to claim 10, wherein the plurality of spacers is formed by photolithography or a transfer method.

14. The manufacturing method according to claim 10, wherein the plurality of spacers has a spherical shape or a columnar shape.

15. The manufacturing method according to claim 10, wherein the at least one inorganic light-emitting diode includes a plurality of inorganic light-emitting diodes arranged in a display region defined over the substrate, and the plurality of spacers is arranged outside the display region.

16. The manufacturing method according to claim 10, wherein the plurality of spacers is arranged at a constant pitch.

17. The manufacturing method according to claim 10, wherein at least one of the plurality of spacers is arranged in the pixel.

18. The manufacturing method according to claim 10, wherein the at least one inorganic light-emitting diode includes a plurality of inorganic light-emitting diodes, and at least one of the plurality of inorganic light-emitting diodes is different in height from at least another one of the plurality of inorganic light-emitting diodes.

* * * * *